United States Patent [19]

Poradish et al.

[11] Patent Number: 5,293,511
[45] Date of Patent: Mar. 8, 1994

[54] PACKAGE FOR A SEMICONDUCTOR DEVICE

[75] Inventors: Frank Poradish; John T. McKinley, both of Plano, Tex.

[73] Assignee: Texas Instruments Incorporated, Dallas, Tex.

[21] Appl. No.: 33,687

[22] Filed: Mar. 16, 1993

[51] Int. Cl.$^5$ ............................................. H01L 33/00
[52] U.S. Cl. ...................... 257/434; 257/432; 257/680; 257/700; 257/703; 257/704
[58] Field of Search ............... 257/432, 434, 680, 700, 257/703, 704

[56] References Cited

U.S. PATENT DOCUMENTS 4,785,338 11/1988 Kinoshita et al. .................... 257/434

Primary Examiner—Edward Wojciechowicz
Attorney, Agent, or Firm—John D. Kaufmann; James C. Kesterson; Richard L. Donaldson

[57] ABSTRACT

A package (44) for a semiconductor device (10) includes a
ceramic base (46, 146) with a mounting surface (50, 150) for supporting the device (10) and a light-transmissive cover (42, 142). A refractory seal ring (70) is fused to the base (46, 146) and to conductive paths (22) thereon. The upper surface (72) of the seal ring (70) is rendered optically flat with a selected angular relationship to the mounting surface (50). The upper and lower faces (76 & 78) of the cover (42, 142) are rendered optically flat with a selected angular relationship to each other, so that with an outer portion of the lower face (78) resting on the upper surface (72) of the seal ring (70), the faces (76, 78) have a selected angular relationship with the mounting surface (50, 150). The package (44) is expedient where the device (10) includes DMD's (30) having deflectable, light-reflective beams (32). The lower face (78) of the cover (42) includes an annular light-reflective coating (60, 160) surrounding a window (80) overlying the device (10). In some embodiments, the reflective coating (60) is deposited on the walls (56, 58) of a groove (54) formed in the lower face (78) of the cover (42). Facilities (90, 72/78 or 100) seal the cover (42, 142) to the seal ring (70). The reflective coating (60, 160) prevents any unmodulated light which is incident on the beams (32) from entering an optical system associated with the DMD-containing device (10). The sealing facilities (90, 72/78 or 100) include adhesives (90), which may contain microspheres, soft metals (90), glass frits (90), fusion bonding of the cover (42) to the seal ring (70), and solder preforms (100).

79 Claims, 5 Drawing Sheets

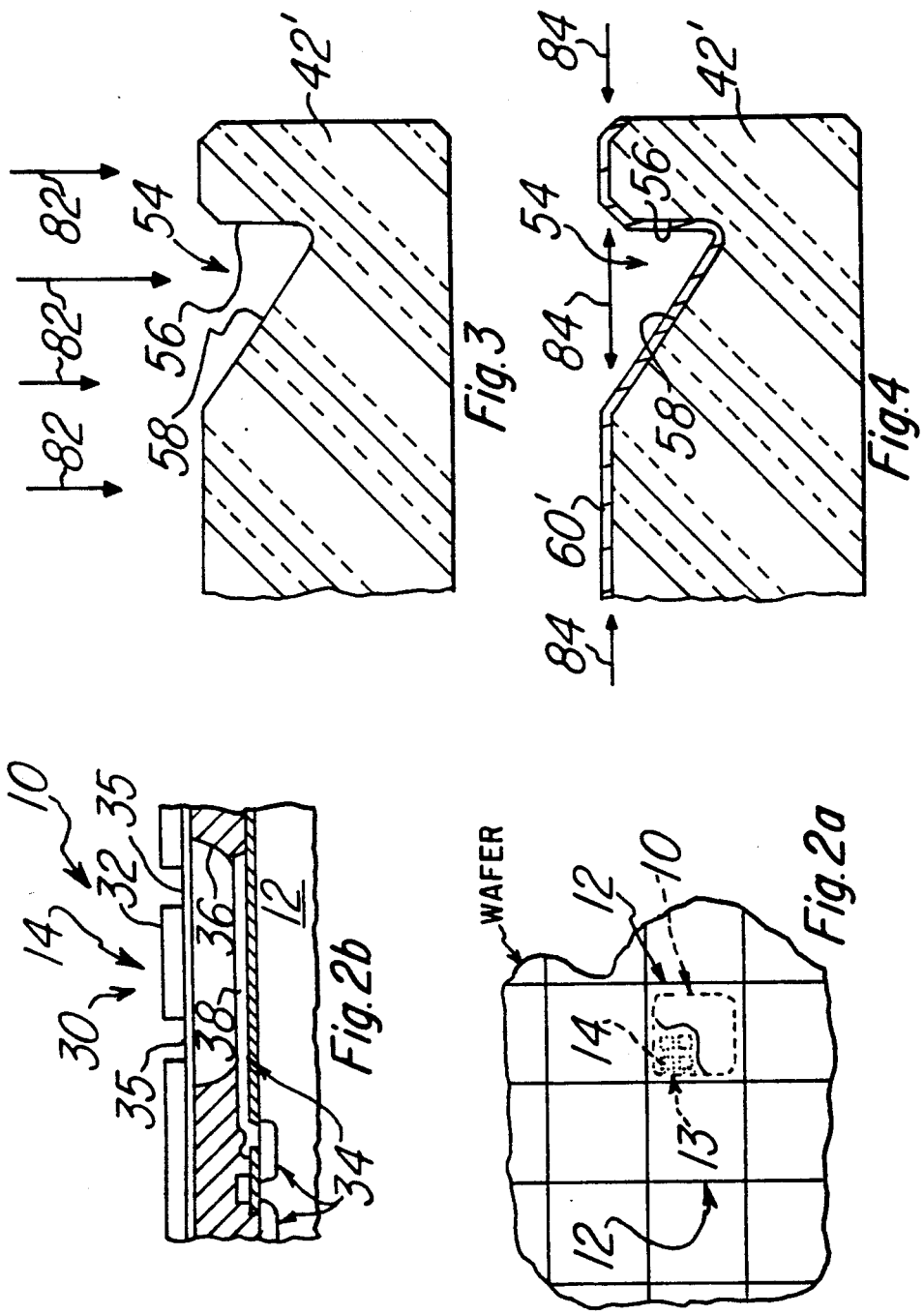

PACKAGE FOR A SEMICONDUCTOR DEVICE

BACKGROUND OF THE INVENTION

The present invention relates to a package for a semiconductor device, and, more particularly, to a protective package for a spatial light modulator ("SLM") which includes an array of active sites, each of which, in turn, includes a deflectable, light-reflecting beam and address circuitry for selectively deflecting the beam.

Numerous processes are known for producing active sites on a first surface of semiconductor wafers. The active sites may comprise one or more transistors and may include an integrated circuit having a variety of other circuit components. Wafers are ultimately separated into a plurality of individual chips, also known as dies or bars, each of which includes an array of active sites and a surface comprising a portion of what was formerly the wafer's first surface. Each active site has associated therewith one or more bond pads on the first surface. The bond pads are rendered electrically continuous with the active site, typically by depositing or otherwise forming the bond pads on top of, and in electrical contact with conductors formed on the wafer. Often some of the same steps used to produce the active sites also produce the conductors, which are themselves electrically continuous with the active sites.

The separation of the wafer into individual chips is produced by an operation which may be referred to as "sawing." Sawing separates the wafer along lines or paths extending between locations whereat adjacent active sites reside or will ultimately reside.

Wafers are often sawed into chips before effecting the processing which produces the active sites. The resulting chips are maintained in a chip matrix after sawing, and the chip matrix is processed to produce the active sites on each one thereof. The active sites may include or be associated with a spatial light modulator ("SLM"), such as that known as a deflectable mirror device or a digital micromirror device (collectively "DMD").

A DMD includes a light-reflective beam or similar mechanical member, which is associated with an active site and is so mounted to, or hinged from, the material of the wafer and the resulting chip as to be deflectable or movable between a normal position and one or more other positions. Deflection of the beam is achieved by attracting the beam toward or to an adjacent electrode which is at a different electrical potential from that of the beam. Deflection of the beam stores energy in the mount or hinge, which stored energy tends to return the beam to its normal position. Movement of the beam, which may be binary or analog, is controlled by the circuit components of the active sites associated with the beams. Deflection of the beam is facilitated by an undercut well which underlies the beam. The well is formed by appropriate etching of the wafer/chip material.

In use, an array or matrix of DMD's is arranged to receive light from a source. The received light which is incident on the reflective beams is selectively reflected or not reflected onto a viewing surface depending on the position of the beam. Such reflected light may be directed by each beam onto the viewing surface only when it is in one of its possible positions. In all other positions of each beam, the incident, reflected light is directed in such a way that it does not fall on the viewing surface. Appropriate energization of the circuit components associated with each beam of each active site permits the beam-reflected light on the surface to be presented as a rasterized array of pixels (as in a typical television) or as a scanning line of pixels (as in a line printer).

Because a DMD includes both circuit components, as well as a microminiature deflectable beam, it is especially sensitive to the environment and is, accordingly, typically sealed in a package which permits light to reach and to be reflected from the beams of the array. The package is desirably inexpensive to manufacture and to emplace and should not adversely affect the operation of the associated DMD's. Moreover, as noted above, unmodulated light is not reflected by the beams to a viewing surface. However, unless care is taken to properly "handle" this unmodulated light its reflection and/or absorption by surfaces in and surrounding the DMD may cause it to act as though it was modulated and to reach the viewing surface. As a consequence, it is also desirable if a DMD package also prevented, or aided in preventing, unmodulated light from reaching the viewing surface.

Accomplishing the above desiderata is one of the objects of the present invention.

SUMMARY OF THE INVENTION

With the above and other objects in view, one aspect of the present invention contemplates a package for a semiconductor device. The device may be a DMD which includes an array of light-reflecting beams. The beams are individually movable between one position and one or more other positions. In the one position, light incident on the beam is modulated, that is, the incident light is reflected by the beam onto a viewing surface. In the other positions the incident light is not modulated, that is, the reflected light is not directed by the beam onto the viewing surface.

The package includes a ceramic base which has a mounting surface for supporting the device. The mounting surface may be the floor of a device-conformal, device-receiving cavity formed in the base. Preferably, the base is made by molding. A first metallic pattern on the base includes first metallic paths extending from near the periphery of the base to near the periphery of the mounting surface. The paths are connected to the mounted device.

A torroidal, electrically insulative, refractory seal ring overlies the base and the first metallic paths between the peripheries of the base and the mounting surface. The lower surface of the seal ring is fused to the underlying base and the first metallic paths. The upper surface of the seal ring is ground and polished so as to be optically flat with a selected angular relationship relative to the mounting surface.

A light-transmissive glass cover overlies the device. The cover is generally congruent with the outer periphery of the seal ring. The upper and lower faces of the cover are ground and polished to optical flatness and have a selected angular relationship to each other. In this way, with the outer portion of the lower face of the cover resting on the seal ring, the upper and lower faces have a selected angular relationship to the mounting surface.

The lower face of the cover may carry an annular light-reflective coating. The coating defines a central uncoated window aligned with the device. In preferred embodiments, the lower face of the cover has an annular groove formed therein, with the coating residing in the groove. The groove, and the coating itself, generally overlie the inner periphery of the seal ring and the periphery of the mounting surface. Where the groove is present, it is preferably triangular in cross-section, having an outer wall which is generally perpendicular to the faces of the cover and an inner wall which slopes away from the outer wall toward the lower face of the cover.

Facilities are provided for sealing the outer portion of the lower face of the cover to the seal ring. These facilities may take five different forms.

First, the sealing facilities may comprise an adhesive at the interface of the seal ring and the lower face of the cover. Preferably, the adhesive is a low outgassing adhesive and may be or include a thermosetting epoxy or a UV-curable adhesive. If the adhesive does outgas to some extent, a known getter may be included beneath the cover, preferably in the annular groove if it is present.

Second, the sealing facilities may comprise a soft metal at the interface of the seal ring and the lower face of the cover. Soft metals such as indium or an indium alloy are preferred, and the cover and seal ring are sealed together by applying to the interface cold-flow-effecting forces which are perpendicular and/or parallel thereto. The parallel forces may be vibratory.

Third, the sealing facilities may comprise the ground and polished portions of the seal ring and the lower face of the cover. Specifically, if these are ground and polished so as to be sufficiently optically flat, the application of force perpendicular to the interface effects a fusion bond of the cover to the seal ring. In the foregoing event, the ground and polished portions are optically flat to about one fringe or less.

In both the second and third aspects, the sealing facility may further comprise an adherent substance applied to the cover and the seal ring at the outer periphery of the interface therebetween. The adherent substance, which may be an epoxy or other adhesive, prevents shear forces applied parallel to the interface from relatively moving the cover and the seal ring.

Fourth, the sealing facility may comprise a solderwettable coating on the upper surface of the seal ring and on the lower face of the cover. A solder layer seals the two coatings together. Preferably, the solder layer is produced by placing a solder preform at the interface of the cover and the seal ring and then applying heat to the preform which melts it. The resolidified solder seals the interface. The heat may be applied to the preform as radiant energy which may pass through the cover. In this latter event, if the coating on the lower face of the cover reflects light, the coating may be discontinuous, as in an annular band, the discontinuity permitting the radiant energy to reach the preform through the cover.

Fifth, the sealing facility may comprise a glass frit layer at the interface of the cover and the seal ring. The frit layer may be produced by placing a frit preform at the interface and then fusing the preform to the cover and the seal ring. As with the solder preform, the fusion may be effected by concentrated radiant energy applied to the preform through the cover.

Where the reflective coating resides in the groove formed in the cover, the coating is preferably produced by metallizing without masking the entire lower face of the cover, including the walls of the groove. Thereafter the non-groove portion of the lower face is ground and polished to remove the coating from all but the walls of the groove.

In further embodiments, the first metallic pattern includes a ground path. Both the ground path and the light-reflective coating on the cover are electrically conductive. Facilities are provided for electrically interconnecting the ground path and the light-reflective coating when the cover rests on the seal ring. Where the groove is present in the cover, the electrical interconnecting facility includes in the groove a conductive mesa which is electrically continuous with the light-reflective coating and compliant facility attached to the ground path for resiliently engaging the mesa when the cover rests on the seal. Both the foregoing and sufficient spacing of the cover from the device limit or prevent the build-up of static electric charge on the cover. Where the device includes a deflectable beam, static charge on the cover can adversely affect deflection of the beam.

The package of the present invention may include the aforedescribed semiconductor device and one or more chips which are electrically associated with the device. In this event, the ceramic base may include one or more additional cavities. Each additional cavity is adapted to retain a chip. The size of the seal ring and the cover is sufficient for the former to surround all of the cavities and the latter to overlie all of the cavities. Preferably the cavity holding the device is generally centrally located with respect to the additional cavities. Second metallic paths extend from the first metallic paths to the second cavities. These second paths also extend among the second cavities and extend from the second cavities to the periphery of the base. The seal ring is preferably fused to the base and to the underlying first and second metallic paths which extend to the base's periphery. Electrical connections between or among the second metallic paths may cross over the first metallic paths. These cross-over connections may comprise wires which insulatively cross over selected some metallic paths and are bonded to other metallic paths.

BRIEF DESCRIPTION OF THE DRAWINGS

FIGS. 2a and 2b are a general depiction of one type of semiconductor device with which the present invention may be utilized;

FIG. 3 illustrates a portion of the cover, which is an element of the package of FIG. 1 according to the present invention, schematically illustrating the deposition on the cover of the light-reflective coating;

FIG. 4 illustrates the cover portion shown in FIG. 3 following deposition of the light-reflective coating and schematically illustrating removal of some of the coating so that only a selected area of the cover is light-reflective;

DETAILED DESCRIPTION

Figure 1:
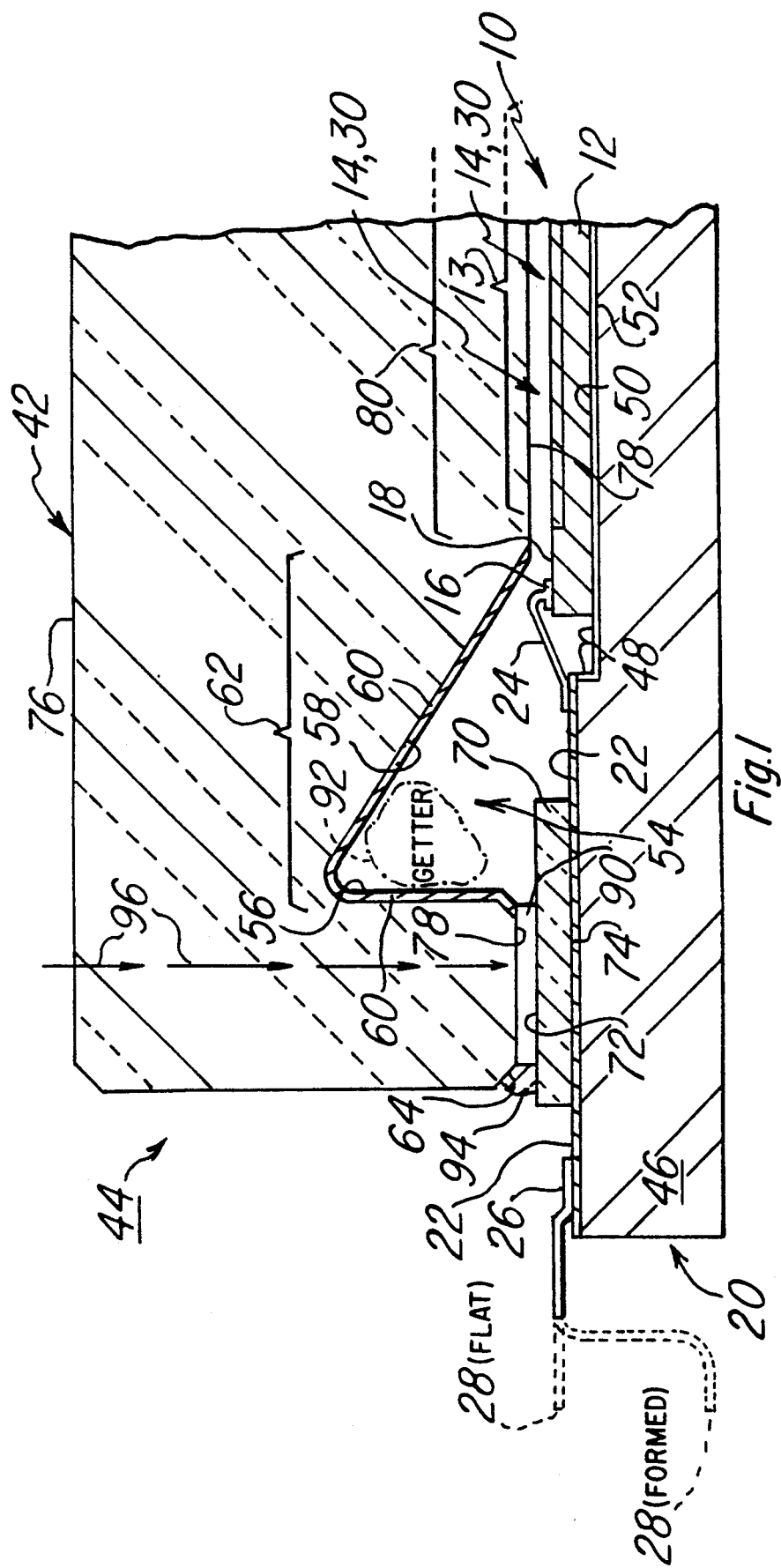
FIG. 1 is a sectioned side view of a portion of a semiconductor device and one embodiment of a packed therefore according to the principles of the present invention, the package including a cover which includes a light-reflective coating on an annular groove formed in the cover.

Referring first to FIGS. 1, 2a and 2b, there is shown a semiconductor device 10 which is formed on and in a semiconductor chip 12 sawed from a wafer (not shown). Numerous such chips 12 are sawed from the wafer, as is well known. The chip 12 includes an array 13 of active sites, generally indicated at 14, and one or more associated bond pads 16. The bond pads 16 are electrically continuous with their active sites 14 via conductors 18 deposited on the wafer. The conductors 18 may be produced by some of the same procedures which produce the active sites 14 and are electrically continuous therewith. The bond pads 16 are typically formed on, and in electrical continuity with, appropriate ones of the conductors 18. Ultimately, each chip 12 is mounted to a header 20 and the bond pads 16 are rendered electrically continuous with conductive lands 22 on the header 20 by bonding wires 24 to and between the pads 16 and the lands 22. The conductive lands 22 may, in turn, be connected to the individual leads 26 of a frame 28, again as is well known. The leads 26 may be flat or formed, as alternatively shown in phantom in FIG. 6, and the frame 28 may be leaded or leadless. Further, as is well known, the leads of a preformed lead frame (not shown) may replace some or all of the lands 22, or, as depicted in the Figures, a preformed leadframe 28 may be attached to the fired lands 22 to provide electrical paths to circuit boards or other utilization items.

The active sites 14 may each include a DMD or other SLM, generally denoted 30. Preferred DMD's 30 include those of the type shown in commonly assigned U.S. Pat. Nos. 5,061,049 to Hornbeck and 3,600,798 to Lee. Other types of DMD's 30, such as those shown in U.S. Pat. Nos. 4,356,730 to Cade, 4,229,732 to Hartstein et al, 3,896,338 to Nathanson et al. and 3,886,310 to Guldberg et al. Any of the above types of DMD's may be used in the type of systems shown in commonly assigned U.S. Pat. Nos. 5,101,236 to Nelson et al. 5,079,544 to DeMond et al, 5,041,851 to Nelson, and 4,728,185 to Thomas.

As generally depicted in FIG. 2, the preferred DMD 30 includes a reflective, deflectable beam 32 and associated circuit components 34, which function as addressing circuits, for selectively deflecting the beam 32. Preferred and other methods of monolithically forming the beams 32 and the circuit components 34 are set forth in the above-noted patents. Typically, the beam 32 deflects by moving or rotating up and down on one or more hinges or torsion members 35. An undercut well 36 is formed in a layer of the chip 12 beneath each beam 32 to accommodate the deflection. Usually, deflection of the beam 32 is effected by the attractive force exerted thereon by an electric field resulting from a potential on an electrode 38 located in the well 36. The electrode's potential is produced by the circuit components 34 with which the beam 32 and the electrode 38 are electrically continuous.

The header 20 and a cover 42 comprise a package 44 according to the present invention.

The header 20 includes a base 46 made of molded ceramic material. The conductive lands 22 may be deposited on the base 46 while its material is green and the two may be fired together to bond the lands 22 to the base 46. Greater accuracy in locating the lands 22 has, however, been achieved by depositing them on the base 46 after it has been fired and then fusing the lands 22 thereto by appropriate heat application. The leads 26 are bonded to the lands 22 in any well known manner.

Figure 9:
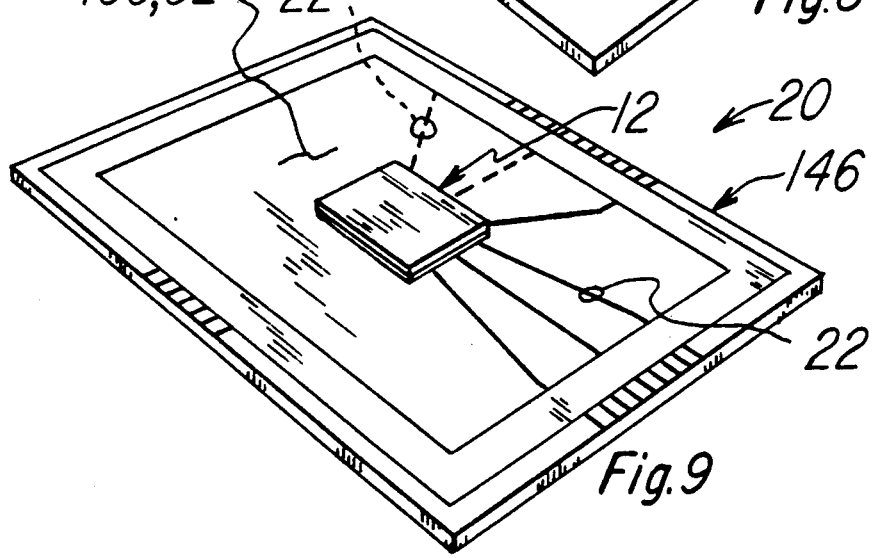
FIG. 9 depicts a portion of a base for use in the package of the present invention which base is an alternative to that shown in FIGS. 4–7.

In some embodiments the green molded base 46 has a cavity 48 formed therein. Appropriate measures are taken so that the floor 50 of the cavity serves as a precision mounting surface for the chip 12. That is, the floor or mounting surface 50 is flat and has a defined angular relationship to the critical surfaces of the chip 12 and its active sites 14, particularly the reflective beams 32 thereof. FIG. 9 depicts an alternative base 146 which lacks the cavity 48 but which has an upper surface 150 which is produced so as to define a flat mounting surface having the defined relationships with the critical surfaces of the chip 12. Whichever cover 42 or 142 is used with the base 146, it may be necessary to form therein a recessed or relieved region to accommodate the device 10 which is elevated above the surface 150. Where the cavity 48 is present, it is configured to generally conformally receive the chip 12. As is known, the floor 50 (and the surface 150) may include a conductive coating 52 which is grounded as convenient to prevent the build up of static charge on the base which might adversely affect the operation of the device 10.

Figure 6:
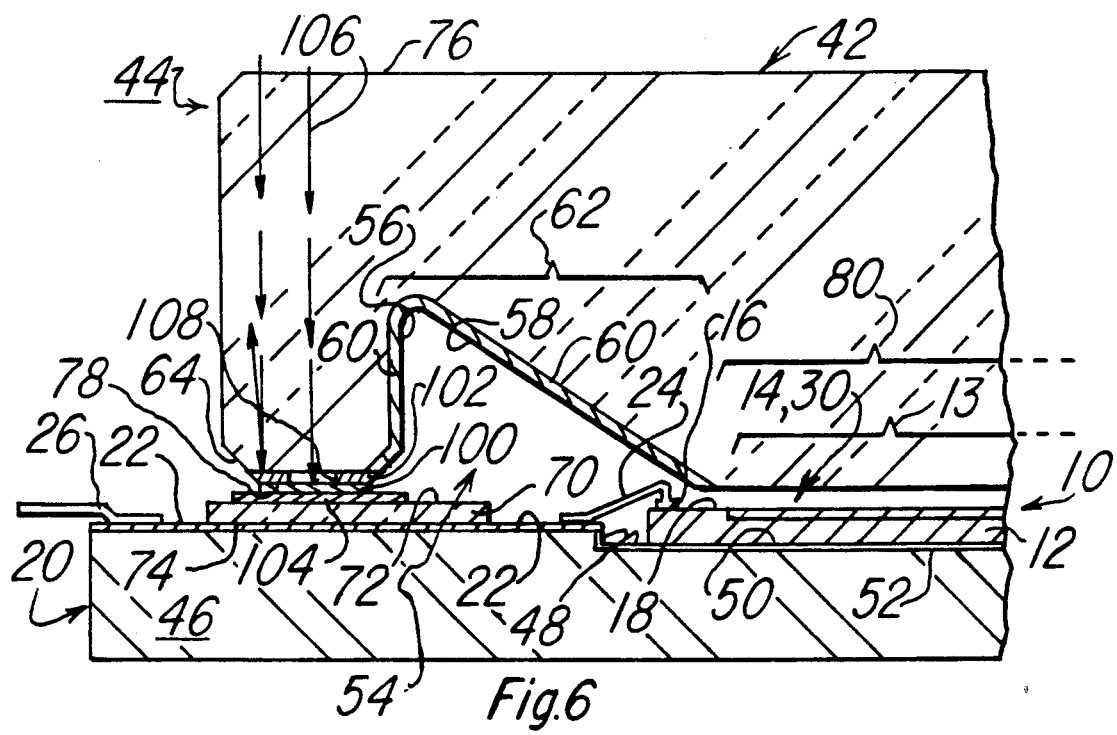
Figure 7:
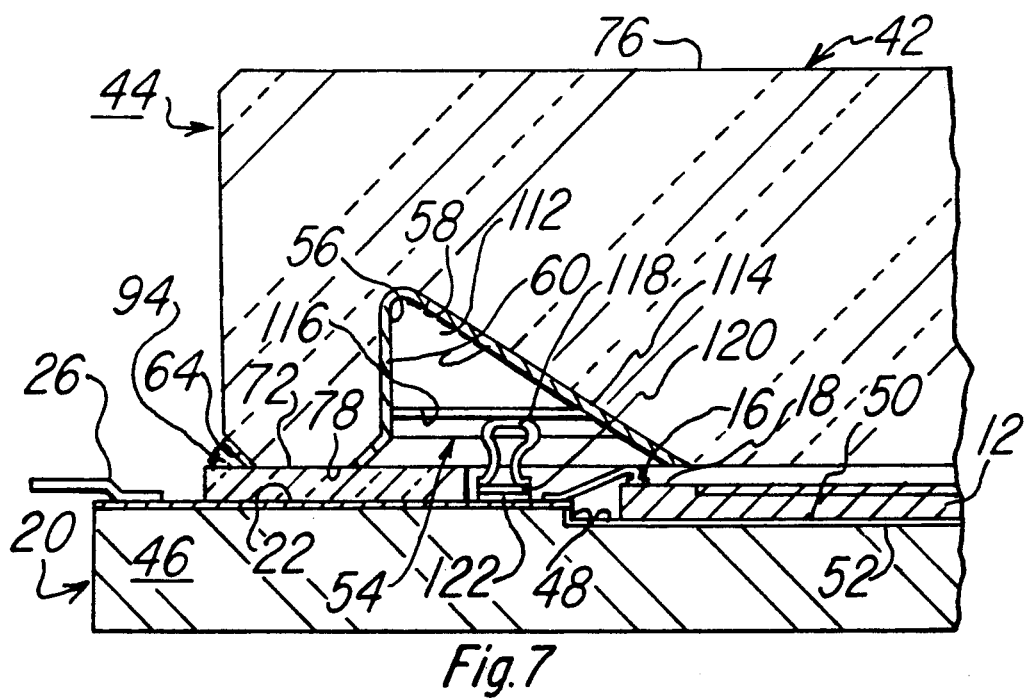
FIG. 7 is a view similar to FIG. 5 illustrating facilities added to the cover for preventing the build-up of static charge on the cover.
Figure 8:
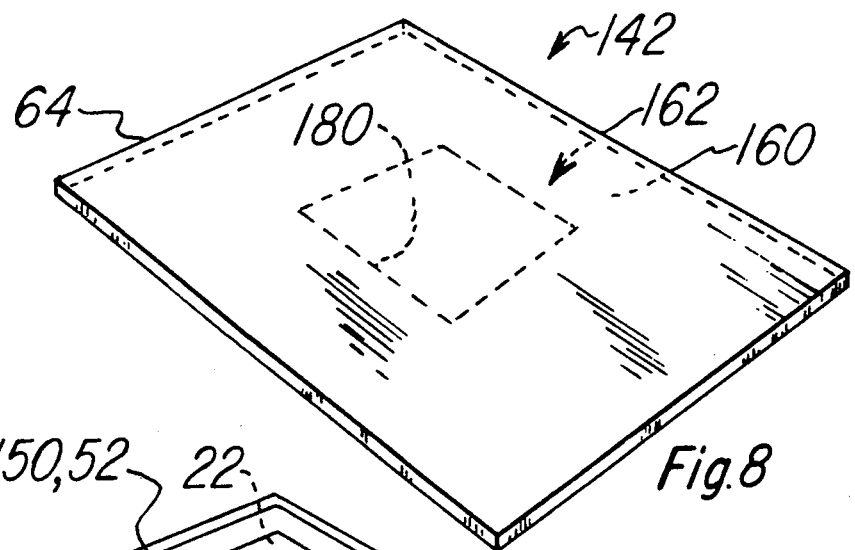
FIG. 8 shows a form of cover for use in the present invention which is an alternative to that shown in FIGS. 1 and 3–6.

The covers 42 shown in FIGS. 1 and 5–7 contain an annular groove 54 the walls 56 and 58 of which are covered with a light-reflective coating 60 to define an annular light-reflective facility 62 near the periphery 64 of the covers 42. The alternative cover 142 shown in FIG. 8 is essentially flat (it does not include the groove 54), but also includes a light-reflective coating 160 which is configured to define an annular light-reflecting facility 162 near its periphery 164. Typically, the cover 42 is used whether or not the device 10 resides in the cavity 48 and the optical system (not shown) with which the device 10 is used includes prisms. If such optical system does not include prisms, the flat cover 142 may be used. As noted above, the cover 42 or 142 may have to relieved or recessed to accommodate the device 10 if the device 10 does not reside in the cavity 48.

The cover 42 or 142 is preferably mounted to the base 46 or 146 via an intermediate glass seal ring 70. The seal ring 70 is a thin, planar, generally annular member having a shape which is similar to the shape of the periphery of the covers 42 or 142. The seal ring 70 is made of glass or a similar material which can be polished to high optical flatness and which can be fused to the base 46 (and the lands 22 thereon), preferably by the application of heat.

As noted earlier, the mounting surfaces 50 and 150 are rendered flat, with a known angular relationship to the critical surfaces of the device 10 as mounted thereon. Similarly, the angular relationship between the mounting surface 50 and 150 and the portions of the bases 46 and 146 which carry the conductive lands 22 is known. Thus, the critical surfaces of the device 10 resting on its mounting surface 50 or 150 have a known angular relationship relative to the land-carrying surface of the base 46 or 146. If upper and lower surfaces 72 and 74 of the seal ring 70 are ground and polished to optical flatness, the upper surface 72 thereof will have a known angular relationship to the critical surfaces of the device 10 when the lower surface 74 rests on the base 46 (or 146) and its lands 22. Similarly, if the upper and lower faces 76 and 78 of the cover 42 (or 142) are ground and polished to optical flatness, with the lower face 78 resting on the upper surface 72 of the seal ring 70, the faces 76 and 78, and the optical path through the cover 42 (or 142) between the faces 76 and 78 will have known relationships to the critical surfaces of the device 10.

In one embodiment, the annular groove 54 has a V-shaped or triangular cross-section, as shown in FIGS. 1 and 5-7. One wall 56 of the groove 54 is perpendicular to the faces 76 and 78 of the cover 42, and the faces 76 and 78 are parallel. The other wall 58 intersects the wall 56 along a line which is toward the periphery 64 of the cover 42 and slopes toward the face 78 of the cover 42. The faces 76 and 78 of the cover 42 are uncoated; the walls 56 and 58 of the groove 54 are covered with the light-reflective coating 60 to produce the annular light-reflective facility 62. This facility 62 defines an uncoated, central window 80 between the faces 76 and 78 of the cover 42 which window 80 is intended to directly overlie the device 10, and particularly the array 13 of active sites 14 with their DMD's 30.

With the outer peripheral area of the lower face 78 of the cover 42 resting on the upper surface 72 of the seal ring 70, the foregoing angular relationships obtain and the window 80 centrally overlies the DMD's 30. There will be shortly described a variety of expedients for sealing the cover 42 to the seal ring 70 to protect the active sites 14 and particularly the DMD's 30 thereof from environmental and other contaminants, while permitting light to reach and be reflected from the beams 32 of the DMD's 30.

The production of the annular reflective coating 60 on the walls 56 and 58 of the annular groove 54 is expediently produced by a maskless process. To produce the covers of FIGS. 1 and 5-7, and referring to FIG. 3, the lower face 78' of a glass member 42' having the general configuration of the cover 42 and having the groove 54 defined therein as convenient, is covered with a metal coating 60' of a light reflective material such as silver or aluminum. This may be achieved by sputtering, vapor or plasma deposition or by any other convenient method which rather indiscriminately coats the entire lower face 78 including the walls 56 and 58 of the groove 54. Such coating is represented in FIG. 3 by the arrows 82. The coated member 42' is shown in FIG. 4.

After the metal coating 60' is deposited, that portion thereof resident on the portions of the lower face 78 which are parallel to the upper face 76 is subjected to grinding and polishing which achieves two goals. First, the coating 60' is removed from the upper-face-parallel portions of the lower face 78, leaving only the coating 60 on the walls 56 and 58 of the groove 54. This removal, which may be achieved by typical methods and which is represented by the arrows 84 in FIG. 4, results in the reflective coating 60 having sharply defined boundaries. Second, the grinding and polishing also causes the lower face to have the desired optical flatness of about one fringe or less. The upper face 76 of the member 42' may be simultaneously, earlier or later ground and polished to complete the production of the cover 42 as described earlier.

Returning to FIG. 1, there is shown a first technique for attaching the cover 42 to the base 46 to form the package 44. An adhesive 90, preferably a low outgassing adhesive is applied to the ground and polished upper surface 72 of the seal ring 70 and/or to the polished and ground outer peripheral areas of the lower face 78 of the cover 42. The height or thickness of this adhesive 90 at this interface 72/78 is greatly exaggerated in FIG. 1.

An aspect of the present invention permits accurate positioning of the cover 42 relative to the seal ring 70 which ensures that the surfaces 72 and 78 are parallel. Such parallel relationship further ensures that the walls 56 and 58 and the reflective coating 60 thereon have the desired angular relationship relative to the active sites 14, and, particularly relative to the beams 32 of the DMDs 30 thereof. Specifically, precision glass or plastic microspheres may be included in the adhesive 90. These microspheres have diameters of 2 mils $+/-1.5$ microns. Such microspheres are known and are available from commercial sources.

The inclusion of the microspheres permits the cover 42 and the seal ring 70 with the microsphere-containing adhesive 90 of the surfaces 72 and 78 to be pressed together until a single tier of microspheres resides at the interface of the surfaces 72 and 78. Simple pressing together results in this single tier, as any microspheres initially super- or sub-jacent to other microspheres simply "roll off" thereof when the cover 42 and the seal ring 70 are pressed together. Since the microspheres have a specific diameter, once the single tier thereof is achieved, this diameter controls and sets the spacing between the surfaces 72 and 78. Such spacing is, of course, 2 mils $+/-1.5$ microns, and the spacing is filled with the same thickness of the adhesive 90. Moreover, the presence of the microspheres in the interface 72/78 maintains the surfaces 72 and 78 substantially parallel.

The adhesive 90 is permitted to cure or set, after which the device 10 is sealed against contaminants which might adversely affect its operation. If outgassing from the adhesive 90 proves troublesome, a getter, generally depicted at 92, may be included at any convenient location within the groove 54 where it is "hidden" by the reflective coating 60 on the walls 56 and 58 thereof. The groove 54 thus provides a getter receptacle for a sealed volume which receptacle would otherwise not be so readily available.

The known angular relationships of the faces 76 and 78 of the cover 42 to the device 10 and to the beams 32 of the DMD's 30 thereof ensures that light properly passes through the cover 42 and its window 80 for incidence on the reflective beams 32 and for reflection of the light back through the cover 42 by the beams when that light is modulated. The angular orientation of the walls 56 and 58 and, hence, the angular orientation of the reflective coating 60 is selected so that light incident on the beams 32 which is not modulated is reflected from the beams 32 onto the coating 60 and from there is reflected in directions whereat the unmodulated light will not and cannot reach the viewing surface. Thus the reflective coating 60 functions to prevent unmodulated light from entering the optical system via which the DMDs 30 project light onto the viewing surface.

Continuing to refer to FIG. 1, in a second technique for sealing the cover 42 to the base 46, the reference numeral 90 designates a soft metal such as indium or indium alloy located at the interface 72/78. Again, the height or thickness of the soft metal 90 is greatly exaggerated in FIG. 1. A suitable soft metal is one which will sufficiently cold flow upon application of force perpendicular and/or parallel to the interface 72/78 to thereafter adhere the cover 42 to the seal ring 70. Depending on the soft metal, it may be appropriate to apply a vibratory force parallel to the interface at an appropriate frequency. Because the soft metal 90 may not be able to prevent relative movement of the cover 42 and the seal ring 70 upon application of shear force to the interface, a bead or separated dabs of an adhesive 94, such as an epoxy adhesive, may be applied to the exterior of the interface 72/78. Because the adhesive 94 is at the exterior of the interface 72/78, potential outgassing therefrom should present no problem.

A third technique for sealing the cover 42 to the base 46 involves the use of a glass frit preform, again designated by the reference numeral 90 with an exaggerated height or thickness in FIG. 1. After the glass frit preform 90 is placed at the interface 72/28, heat, preferably in the form of concentrated radiant energy is applied to the preform 90. It is further preferred that the radiant energy be applied to the preform 90 through the cover 42 as designated by the arrows 96 in FIG. 1. The applied radiant energy fuses the preform 90 to the interface 72/78 to seal the cover 42 and the base 46 together.

Figure 5:
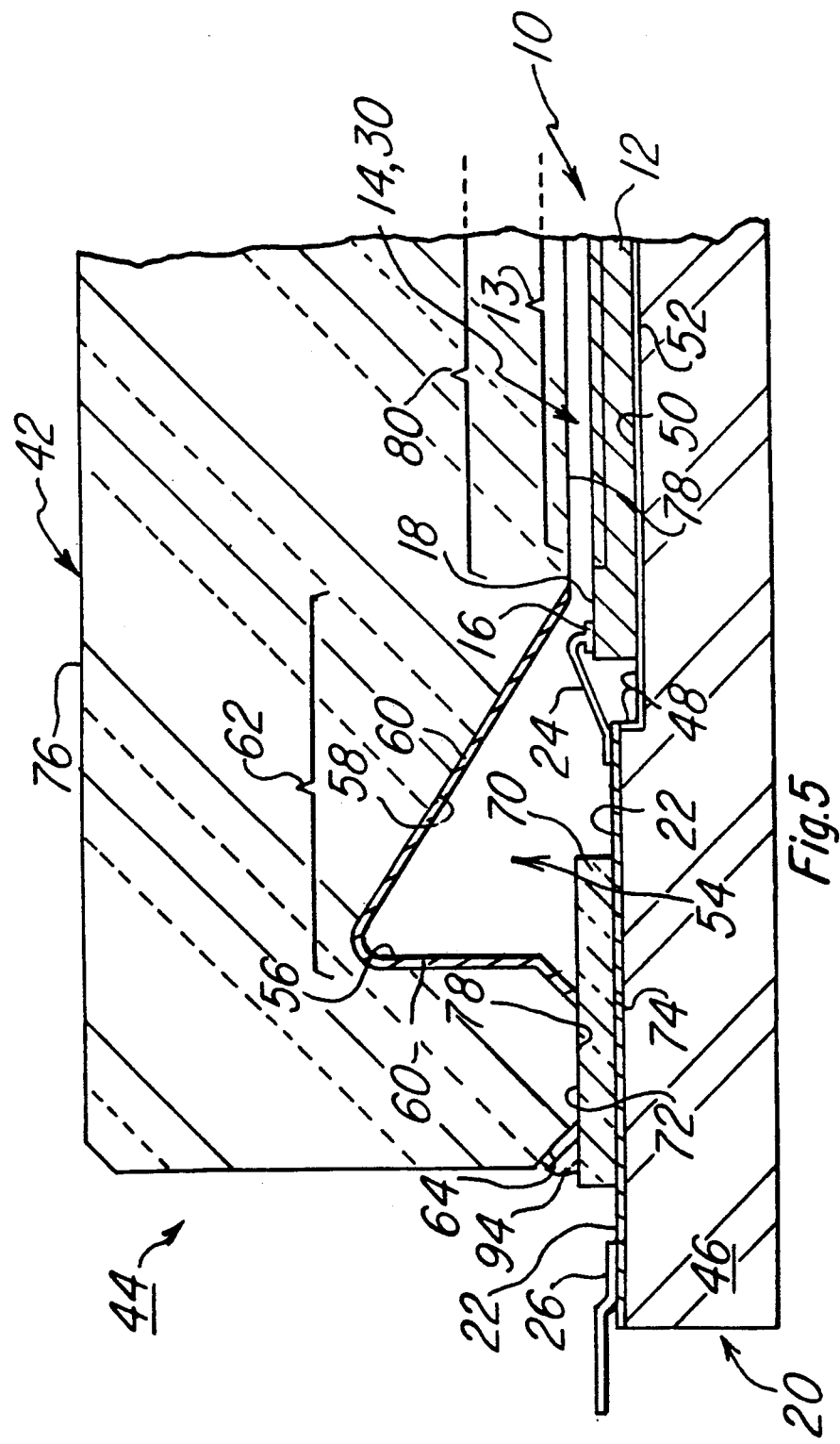
FIGS. 5 and 6 are views similar to FIG. 1 showing alternative embodiments of the cover in that latter Figure.

FIG. 5 illustrates a fourth technique for sealing the cover 42 to the base 46. This technique involves initially polishing the lower face 78 of the cover 42 at and near the outer periphery thereof and the upper surface 72 of the seal ring 70 to an optical flatness of about one fringe or less. Thereafter, the interface 72/78 is fusion bonded by the application of sufficient force perpendicular and/or parallel to the interface 72/78. Similar to the second technique, the fusion bonded interface 72/78 may not be able to resist the application of shear force thereto. Accordingly the adhesive bead or dabs 94 may be applied to the exterior of the interface 72/78.

FIG. 6 represents a fifth technique for sealing the cover 42 to the base 46. This technique uses a solder preform 100 which is placed at the interface 72/78. Prior to this placement, the outer peripheral portion of the lower face 78 of the cover 42 and the upper surface 72 of the seal ring 70 receive a solder-wettable metallic coating 102 and 104, respectively. Since it is preferred that the solder preform 100 be melted by concentrated radiant energy applied thereto through the cover 42 as shown by the arrows 106, the coating 102 includes a discontinuity 108, which is preferably annular, through which the radiant energy 106 may pass to melt the solder preform 100. Without the discontinuity 108 the coating 102 may reflect too much of the radiant energy 106 to permit efficient melting of the preform 100. As in earlier Figures, the thicknesses of the coatings 102, 104 and of the preform 100 is exaggerated in FIG. 6.

The above five techniques may be used to seal the cover 42 to the alternative planar base 146 in which no cavity 48 is formed. The height of the lower face 78 of the cover 42 at the window 80 is adjusted to provide sufficient spacing above the device 10. This may be achieved by appropriate grinding and polishing of the lower face 78 at the window 80 or, preferably, by appropriately adjusting the thickness of the seal ring 70.

The above five techniques may also be used to seal the alternative flat cover 142 to the base 46 having the cavity 48. In this event, the annular reflecting facility 162 would comprise an annular reflective coating 160 on the lower face 78 which defines the window 180. Since the groove 54 is not present, some other location (not shown) for the getter 92, if required, must be provided. The thickness of the seal ring 70 is adjusted to provide required spacing and clearances. Similar expedients are necessary to use the five foregoing techniques for sealing the flat cover 142 to the flat base 146.

The spacing of the lower face 78 of the cover 42 at the window 80 is preferably such that if any electric charge builds up on the cover 42 (or 142) its effect on the deflection of the beams 32 of the DMD's is minimized. As noted above, one way of adjusting this spacing is by adjusting the thickness of the seal ring 70. FIG. 7 illustrates a technique for substantially preventing static build-up on the cover 42.

Specifically, the groove 54 in the lower face 78 of the cover 42 contains a mesa 112 or other surface feature at one or more locations. Preferably, one mesa 112 is located at each corner of the groove 54 where it and the cover 42 are generally rectangular. A lower surface 116 of each mesa 112 is covered with an electrically conductive coating 114, which may be the same as, and may be deposited simultaneously with, the coating 60, with which it is electrically continuous. Since the lower surface 116 of each mesa 112 is recessed below the lower face 78 of the cover 42, the coating 114 is unaffected by the grinding and polishing of such lower face 78 and remains electrically continuous with the reflective coating 60. When the wires 24 are bonded between the bond pads 16 and the lands 22, wire loops 118 may be bonded to conductive, grounded layers 120 formed over the lands 22 and insulated therefrom by an insulative layer 122. The wire loops 118 are sufficiently high to resiliently engage the conductive coating 114 on each mesa 112 when the lower face 78 of the cover 42 rests on the seal ring 70. In this condition, the coatings 114 and the reflective coating 60 are grounded. Such grounding substantially decreases, if it does not eliminate, static electric build-up on the cover 42.

Figure 10:
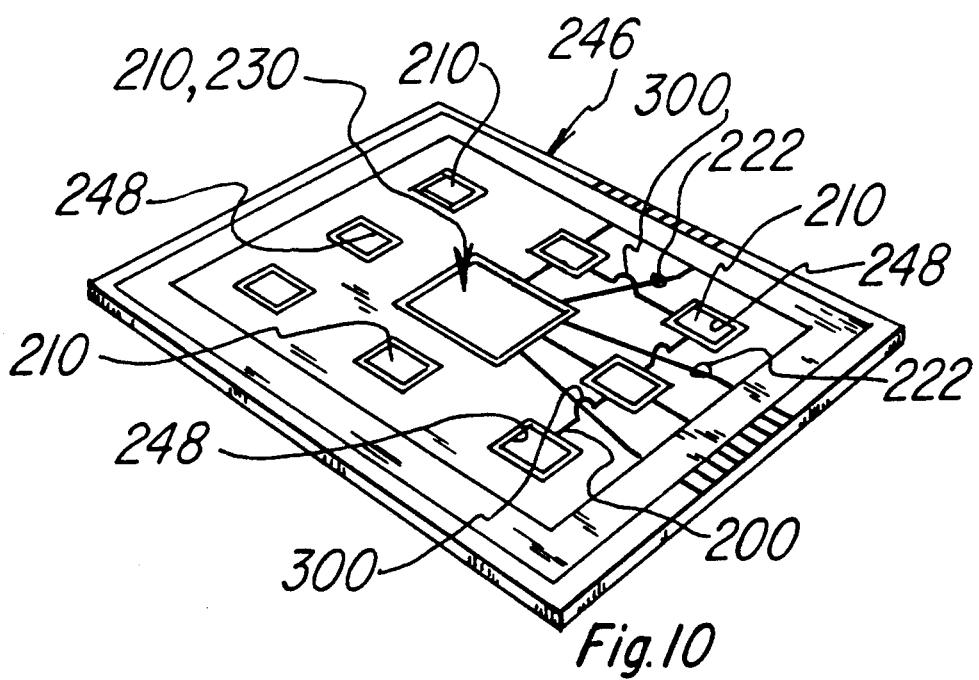
FIG. 10 depicts a base which is an alternative to those shown in FIGS. 4–7 and 9 and which includes facilities for mounting and associating together in a single package according to the principles hereof a plurality of semiconductor device.

FIG. 10 illustrates a variant base 246 to which a cover may be sealed by the above-described techniques. The base 246 may contain plural cavities 248 which conformally receive plural devices 210. The cover 42 or 142 may be flat or may contain the groove 54 at each area overlying a DMD 230, with each groove 54 having its walls 56 and 58 covered with a reflective coating 60. The cover 42 or 142 may be sealed to the base 246 about each respective device 210 and/or may be sealed to the base 246 at the outer peripheries thereof. In a preferred embodiment where only one DMD 230 is present and the other devices 210 are associated with the DMD 230, The DMD and its cavity 248 is centrally located on the base 246. Metallic lands 222 extend from the DMD 230 to the other devices 210, between and among the other devices 210 and from the DMD 230 and the other devices 210 to the periphery of the base 246. These lands 222 may be deposited via any suitable process such as mag-ion. The seal ring 70, which preferably surrounds all of the devices 210, is fused to the base 246 and to the underlying lands 222. Necessary cross-over electrical connections between the lands 222 may comprise wires 200 bonded to respective lands 222 and insulatively crossing over intervening lands 222 as shown at 300. The devices 210 may be customed designed to facilitate single-layer-routing of the interconnections among the devices 210 via the lands 222. The cross-overs 300 are preferably utilized only when total single-layer-routing is not achievable.

While various preferred embodiments of the present invention have been described, those skilled in the art will appreciate that various changes of and additions to these embodiments may be made without departing from the present invention as covered by the following claims.

What is claimed is:

1. A package for a semiconductor device, the device being of the type which includes a light-reflecting beam movable between one position, in which light incident on the beam is and one or more other positions, in which the incident light is modulated, the package comprising:
   a ceramic base having a mounting surface for supporting the device;
   a first metallic pattern on the base, the first pattern including first metallic paths extending from the periphery of the base to the periphery of the mounting surface for electrical connection to the mounted device;
   a generally torroidal and planar seal ring constituted of an electrically insulative, refractory material, the seal ring overlying the base and the first metallic paths between the peripheries of the base and the mounting surface, having its lower surface fused to the underlying base and first metallic paths and having an opposed upper surface ground and polished so as to be optically flat with a selected angular relationship relative to the mounting surface;
   a light-transmissive glass cover overlying the device, which cover is generally congruent with the outer periphery of the seal ring, upper and lower faces of the cover being ground and polished to optical flatness and having a selected angular relationship to each other so that, with the outer portion of the lower face of the cover resting on the seal ring, the upper and lower faces have a selected angular relationship relative to the mounting surface, the lower face of the cover having formed therein an annular groove which generally overlies the inner periphery of the seal ring and the periphery of the mounting surface cavity, the groove being generally triangular in cross-section and having an outer wall which is generally perpendicular to the faces of the cover and an inner wall which slopes away from the outer wall toward the lower face of the cover;
   a light-reflective coating on the walls of the groove; and
   means for sealing the outer portion of the lower face of the cover to the seal ring.

2. Apparatus as in claim 1, wherein:
the sealing means comprises an adhesive at the interface of the seal ring and the lower face of the cover.

3. Apparatus as in claim 2, wherein: the adhesive is a low outgassing adhesive.

4. Apparatus as in claim 3, wherein: the adhesive contains microspheres which reside in the interface in a single tier to fix the width of the interface.

5. Apparatus as in claim 4, wherein: the microspheres are plastic or glass.

6. Apparatus as in claim 2, which further comprises: a getter located in the groove for preventing outgassing from the adhesive from adversely affecting the device.

7. Apparatus as in claim 1, wherein:
the sealing means comprises a soft metal at the interface of the seal ring and the lower face of the cover.

8. Apparatus as in claim 7, wherein:
the soft metal is selected from the group consisting of indium and indium alloy.

9. Apparatus as in claim 7, wherein:
the cover and the seal ring are sealed together by applying force generally perpendicularly to the interface therebetween to cause the soft metal to cold flow.

10. Apparatus as in claim 7, wherein:
the cover and the seal ring are sealed together by applying force generally parallel to the interface therebetween to cause the soft metal to cold flow.

11. Apparatus as in claim 7, wherein:
the cover and the seal ring are sealed together by applying force which is both perpendicular and parallel to the interface therebetween to cause the soft metal to cold flow.

12. Apparatus as in claim 11, wherein:
the force parallel to the interface is vibratory.

13. Apparatus as in claim 7, wherein:
the sealing means further comprises an adherent substance applied to the cover and the seal ring at the outer periphery of the interface therebetween, the adherent substance preventing shear forces applied parallel to the interface from relatively moving the cover and the seal ring.

14. Apparatus as in claim 1, wherein:
the sealing means comprises the ground and polished portions of the seal ring and the lower face of the cover which are sufficiently optically flat so that the application of force perpendicular to the interface therebetween effects a fusion bond of the cover to the seal ring.

15. Apparatus as in claim 14, wherein:
the ground and polished portions are optically flat to about one fringe or less.

16. Apparatus as in claim 14, wherein:
the sealing means further comprises an adherent substance applied to the cover and the seal ring at the outer periphery of the interface therebetween, the adherent substance preventing shear forces applied parallel to the interface from relatively moving the cover and the seal ring.

17. Apparatus as in claim 1, wherein:
the sealing means comprises
   a solder-wettable coating on the upper surface of the seal ring,
   a solder-wettable coating on the outer portion of the lower face of the cover, and
   a solder layer sealing the coatings together.

18. Apparatus as in claim 17, wherein:
the solder layer is produced by placing a solder preform at the interface of the cover and the seal ring and then applying sufficient heat to the preform to effect melting thereof, following which the solder resolidifies to seal the interface.

19. Apparatus as in claim 18, wherein:
the heat is applied to the preform in the form of concentrated radiant energy.

20. Apparatus as in claim 19, wherein:
the radiant energy is applied to the preform through the cover.

21. Apparatus as in claim 20, wherein the coating on the outer portion of the lower face of the cover is radiant-energy-reflective and wherein:

the coating on the outer portion of the lower face of the cover is discontinuous between the inner and outer peripheries of the outer portion for the full circumference of the outer portion, the discontinuity permitting the radiant to reach and melt the preform.

22. Apparatus as in claim 1, wherein:
the sealing means comprises a glass frit layer at the interface of the cover and the seal ring.

23. Apparatus as in claim 22, wherein:
the glass frit layer is produced by placing a glass frit preform at the interface and then fusing the preform to the cover and the seal ring.

24. Apparatus as in claim 23, wherein:
the fusing of the preform is effected by the application to the preform of concentrated radiant energy.

25. Apparatus as in claim 24, wherein:
the radiant energy is applied to the preform through the cover.

26. Apparatus as in claim 1, wherein:
the first metallic pattern is deposited on the base when the ceramic thereof is green, the base being thereafter fired to fuse the first pattern to the base.

27. Apparatus as in claim 26, wherein:
the seal ring is placed on the base when the seal ring is green, the seal ring being thereafter fired to fuse the seal ring to the base and the first metallic pattern.

28. Apparatus as in claim 1, wherein:
the first metallic pattern is deposited on the base after the ceramic has been fired, the first pattern being thereafter fired to fuse it to the base.

29. Apparatus as in claim 28, wherein:
the seal ring is placed on the base when the seal ring is green, the seal ring being thereafter fired to fuse the seal ring to the base and the first metallic pattern.

30. Apparatus as in claim 1, wherein:
the light-reflective coating on the walls of the groove is produced by simultaneously metallizing without masking the walls of the groove and the lower face of the cover and then grinding and polishing the lower face of the cover to remove the metallization therefrom.

31. Apparatus as in claim 1, which further comprises:
a ground path in the first metallic pattern, the ground path and the light-reflective coating being electrically conductive, and
means for electrically interconnecting the ground path and the light-reflective coating when the cover rests on the seal ring.

32. Apparatus as in claim 31, wherein:
the electrical interconnecting means comprises
an electrically conductive surface feature located in the groove and being electrically continuous with the light-reflective coating, and
compliant means attached to the ground path for resiliently electrically engaging the surface feature when the cover rests on the seal.

33. Apparatus as in claim 32, wherein:
the interconnection of the ground path and the light-reflective coating is effective to obviate the presence on the cover of a static electric charge sufficiently large to adversely affect the movement of the beam.

34. Apparatus as in claim 32, wherein:
the portion of the cover overlying the device is spaced sufficiently far therefrom to obviate any static electric charge on the cover from adversely affecting the movement of the beam.

35. Apparatus as in claim 34, wherein:
the interconnection of the ground path and the light-reflective coating is effective to obviate the presence on the cover of a static electric charge sufficiently large to adversely affect the movement of the beam,
the interconnection and the cover-device spacing minimizing any significant static electric charge on the cover and preventing such charge as occurs from adversely affecting movement of the beam.

36. Apparatus as in claim 1, wherein:
the base has a device-conformal, device-receiving first cavity therein, and
the mounting surface is a floor of the cavity.

37. A package for a semiconductor device, the device being of the type which includes a light-reflecting beam movable between one position, in which light incident on the beam is modulated, and one or more other positions, in which the incident light is not modulated, the package comprising:
a ceramic base having a mounting surface for supporting the device;
a first metallic pattern on the base, the first pattern including first metallic paths extending from near the periphery of the base to near the periphery of the mounting surface for electrical connection to the mounted device;
a generally torroidal and planar seal ring constituted of an electrically insulative, refractory material, the seal ring overlying the base and the first metallic paths between the peripheries of the base and the mounting surface, having its lower surface fused to the underlying base and first metallic paths and having an opposed upper surface ground and polished so as to be optically flat with a selected angular relationship relative to the mounting surface;
a light-transmissive glass cover overlying the device, which cover is generally congruent with the outer periphery of the seal ring, upper and lower faces of the cover being ground and polished to optical flatness and having a selected angular relationship to each other so that, with the outer portion of the lower face of the cover resting on the seal ring, the upper and lower faces have a selected angular relationship relative to the mounting surface;
a generally annular light-reflective coating on the lower face of the cover, the coating defining a central uncoated window aligned with the device; and
means for sealing the outer portion of the lower face of the cover to the seal ring.

38. Apparatus as in claim 37, wherein:
the lower face of the cover has formed therein an annular groove which generally overlies the inner periphery of the seal ring and the periphery of the mounting surface cavity, the light reflective coating residing on the walls of the groove.

39. Apparatus as in claim 38, wherein:
the groove is generally triangular in cross-section and has an outer wall which is generally perpendicular to the faces of the cover and an inner wall which slopes away from the outer wall toward the lower face of the cover.

40. Apparatus as in claim 37, wherein:

the sealing means comprises an adhesive at the interface of the seal ring and the lower face of the cover.

41. Apparatus as in claim 40, wherein:
the adhesive is a low outgassing adhesive.

42. Apparatus as in claim 40, wherein:
the adhesive contains microspheres which reside in the interface in a single tier to fix the width of the interface.

43. Apparatus as in claim 42, wherein:
the microspheres are plastic or glass.

44. Apparatus as in claim 37, which further comprises:
a getter located in the volume defined by the base, the seal ring and the cover for preventing outgassing from the adhesive from adversely affecting the device.

45. Apparatus as in claim 37, wherein:
the sealing means comprises a soft metal at the interface of the seal ring and the lower face of the cover.

46. Apparatus as in claim 45, wherein:
the soft metal is selected from the group consisting of indium and indium alloys.

47. Apparatus as in claim 45, wherein:
the cover and the seal ring are sealed together by applying force generally perpendicularly to the interface therebetween to cause the soft metal to cold flow.

48. Apparatus as in claim 45, wherein:
the cover and the seal ring are sealed together by applying force generally parallel to the interface therebetween to cause the soft metal to cold flow.

49. Apparatus as in claim 45, wherein:
the cover and the seal ring are sealed together by applying force which is both perpendicular and parallel to the interface therebetween to cause the soft metal to cold flow.

50. Apparatus as in claim 49, wherein:
the force parallel to the interface is vibratory.

51. Apparatus as in claim 45, wherein:
the sealing means further comprises an adherent substance applied to the cover and the seal ring at the outer periphery of the interface therebetween, the adherent substance preventing shear forces applied parallel to the interface from relatively moving the cover and the seal ring.

52. Apparatus as in claim 37, wherein:
the sealing means comprises the ground and polished portions of the seal ring and the lower face of the cover which are sufficiently optically flat so that the application of force perpendicular to the interface therebetween effects a fusion bond of the cover to the seal ring.

53. Apparatus as in claim 52, wherein:
the ground and polished portions are optically flat to about one fringe or less.

54. Apparatus as in claim 52, wherein:
the sealing means further comprises an adherent substance applied to the cover and the seal ring at the outer periphery of the interface therebetween, the adherent substance preventing shear forces applied parallel to the interface from relatively moving the cover and the seal ring.

55. Apparatus as in claim 37, wherein:
the sealing means comprises
a solder-wettable coating on the upper surface of the seal ring,
a solder-wettable coating on the outer portion of the lower face of the cover, and
a solder layer sealing the coatings together.

56. Apparatus as in claim 55, wherein:
the solder layer is produced by placing a solder preform at the interface of the cover and the seal ring and then applying sufficient heat to the preform to effect melting thereof, following which the solder resolidifies to seal the interface.

57. Apparatus as in claim 56, wherein:
the heat is applied to the preform in the form of concentrated radiant energy.

58. Apparatus as in claim 57, wherein:
the radiant energy is applied to the preform through the cover.

59. Apparatus as in claim 58, wherein the coating on the outer portion of the lower face of the cover is radiant-energy-reflective and wherein:
the coating on the outer portion of the lower face of the cover is discontinuous between the inner and outer peripheries of the outer portion for the full circumference of the outer portion, the discontinuity permitting the radiant to reach and melt the preform.

60. Apparatus as in claim 37, wherein:
the sealing means comprises a glass frit layer at the interface of the cover and the seal ring.

61. Apparatus as in claim 60, wherein:
the glass frit layer is produced by placing a glass frit preform at the interface and then fusing the preform to the cover and the seal ring.

62. Apparatus as in claim 61, wherein:
the fusing of the preform is effected by the application to the preform of concentrated radiant energy.

63. Apparatus as in claim 62, wherein:
the radiant energy is applied to the preform through the cover.

64. Apparatus as in claim 37, wherein:
the first metallic pattern is deposited on the base when the ceramic thereof is green, the base being thereafter fired to fuse the first pattern to the base.

65. Apparatus as in claim 64, wherein:
the seal ring is placed on the base when the seal ring is green, the seal ring being thereafter fired to fuse the seal ring to the base and the first metallic pattern.

66. Apparatus as in claim 37, wherein:
the first metallic pattern is deposited on the base after the ceramic has been fired, the first pattern being thereafter fired to fuse it to the base.

67. Apparatus as in claim 66, wherein:
the seal ring is placed on the base when the seal ring is green, the seal ring being thereafter fired to fuse the seal ring to the base and the first metallic pattern.

68. Apparatus as in claim 37, which further comprises:
a ground path in the first metallic pattern, the ground path and the light-reflective coating being electrically conductive, and
means for electrically interconnecting the ground path and the light-reflective coating when the cover rests on the seal ring.

69. Apparatus as in claim 68, wherein:
the electrical interconnecting means comprises
a conductive surface feature located in the groove and being electrically continuous with the light-reflective coating, and compliant means attached to the ground path for resiliently electrically engaging the surface feature when the cover rests on the seal.

70. Apparatus as in claim 69, wherein:

the interconnection of the ground path and the light-reflective coating is effective to obviate the presence on the cover of a static electric charge sufficiently large to adversely affect the movement of the beam.

71. Apparatus as in claim 69, wherein:

the portion of the cover overlying the device is spaced sufficiently far therefrom to obviate any static electric charge on the cover from adversely affecting the movement of the beam.

72. Apparatus as in claim 69, wherein:

the interconnection of the ground path and the light-reflective coating is effective to obviate the presence on the cover of a static electric charge sufficiently large to adversely affect the movement of the beam, and the interconnection and the cover-device spacing minimizing any significant static electric charge on the cover and preventing such charge as occurs from adversely affecting movement of the beam.

73. Apparatus as in claim 37, wherein:

the base has a device-conformal, device-receiving first cavity therein, and the mounting surface is a floor of the cavity.

74. Apparatus as in claim 37 adapted to serve as a package for the device and for one or more chips which are electrically associated with the device, which further comprises:

one or more second cavities in the base, each second cavity being adapted to retain one of the chips therein, the size of the seal ring and the cover being sufficient for the former to surround all of the cavities and the latter to overlie all of the cavities.

75. Apparatus as in claim 74, wherein:

the first cavity is generally centrally located with respect to the second cavities.

76. Apparatus as in claim 74, which further comprises:

second metallic paths extending (i) from the first metallic paths to the second cavities, (ii) among the second cavities and (iii) from the second cavities to the periphery of the base, the seal ring being fused to the base and to the underlying metallic paths which extend to the periphery of the base.

77. Apparatus as in claim 76 wherein:

the second metallic paths are formed by selective metallization of the base after fusion of the metallic pattern to the base and before placement of the seal ring on the base.

78. Apparatus as in claim 76 which further comprises:

electrical connections among the second metallic paths, which connections cross over the metallic paths.

79. Apparatus as in claim 78 wherein:

the electrical connections comprise wires insulatively crossing over selected metallic paths and bonded to other selected metallic paths.

* * * * *